United States Patent
Park et al.

(10) Patent No.: US 9,053,971 B2
(45) Date of Patent: Jun. 9, 2015

(54) SEMICONDUCTOR DEVICES HAVING HYBRID CAPACITORS AND METHODS FOR FABRICATING THE SAME

(71) Applicant: Samsung Electronics Co., Ltd., Suwon-si (KR)

(72) Inventors: Dongkyun Park, Suwon-si (KR); Han-Young Kim, Anyang-si (KR); Joon Kim, Seoul (KR); Hyun Park, Suwon-si (KR); Junghwan Oh, Yongin-si (KR); Minhee Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/052,097

(22) Filed: Oct. 11, 2013

(65) Prior Publication Data

US 2014/0110824 A1     Apr. 24, 2014

(30) Foreign Application Priority Data

Oct. 23, 2012   (KR) .......................... 10-2012-0118020

(51) Int. Cl.

| | | |
|---|---|---|
| *H01L 21/02* | (2006.01) | |
| *H01L 29/94* | (2006.01) | |
| *H01L 27/108* | (2006.01) | |
| *H01L 21/20* | (2006.01) | |
| *H01L 49/02* | (2006.01) | |

(52) U.S. Cl.
CPC .......... *H01L 27/10852* (2013.01); *H01L 28/91* (2013.01)

(58) Field of Classification Search
CPC ..... H01L 28/40; H01L 49/02; H01L 23/5223; H01L 27/0805; H01L 28/91; H01L 27/10852

USPC .................. 257/532, 306, 308, E21.008, 303, 257/E29.342; 438/381, 244, 396, 241
See application file for complete search history.

(56) References Cited

U.S. PATENT DOCUMENTS

| | | | | |
|---|---|---|---|---|
| 6,130,128 | A * | 10/2000 | Lin ............................... | 438/253 |
| 2001/0053576 | A1 * | 12/2001 | DeBoer et al. ................ | 438/239 |
| 2002/0024084 | A1 * | 2/2002 | Coursey ........................ | 257/306 |
| 2006/0060907 | A1 * | 3/2006 | Kim et al. ..................... | 257/303 |
| 2006/0261396 | A1 * | 11/2006 | Joo ................................ | 257/306 |
| 2009/0114970 | A1 | 5/2009 | De-Jonghe et al. | |
| 2010/0155892 | A1 * | 6/2010 | Benson ......................... | 257/532 |
| 2011/0159660 | A1 * | 6/2011 | Kang et al. .................... | 438/381 |

FOREIGN PATENT DOCUMENTS

| | | |
|---|---|---|
| KR | 1020040002221 A | 1/2004 |
| KR | 1020040072086 A | 8/2004 |

(Continued)

*Primary Examiner* — Long K Tran
*Assistant Examiner* — Dzung Tran
(74) *Attorney, Agent, or Firm* — Myers Bigel Sibley & Sajovec, PA

(57) ABSTRACT

A semiconductor device includes a plurality of capacitors disposed on a substrate and a support pattern supporting upper portions and lower portions of the capacitors. Each of the capacitors includes a lower electrode, an upper electrode, and a dielectric layer between the lower and upper electrodes. The lower electrode includes a first electrode portion electrically connected to the substrate and having a solid shape and a second electrode portion stacked on the first electrode portion and having a shape comprising an opening therein. The support pattern includes an upper pattern contacting sidewalls of top end portions of the lower electrodes and a lower pattern vertically spaced apart from the upper pattern. The lower pattern contacts sidewalls under the top end portions of the lower electrodes.

20 Claims, 19 Drawing Sheets

(56) References Cited

FOREIGN PATENT DOCUMENTS

| KR | 1020050038758 A | 4/2005 |
| KR | 1020080098895 A | 11/2008 |
| KR | 1020090068776 A | 6/2009 |
| KR | 10-2009-0077157 A | 7/2009 |
| KR | 1020090099775 A | 9/2009 |
| KR | 1020100119445 A | 11/2010 |
| KR | 1020110078020 A | 7/2011 |

* cited by examiner

SEMICONDUCTOR DEVICES HAVING HYBRID CAPACITORS AND METHODS FOR FABRICATING THE SAME

CROSS-REFERENCE TO RELATED APPLICATIONS

This U.S. non-provisional patent application claims priority under 35 U.S.C. §119 to Korean Patent Application No. 10-2012-0118020, filed on Oct. 23, 2012, the entirety of which is incorporated by reference herein.

BACKGROUND

Embodiments of the inventive concept relate to a semiconductor and, more particularly, to semiconductor devices having hybrid capacitors and methods for fabricating the same.

A design rule of a lower electrode of a capacitor has been greatly reduced in a dynamic random access memory (DRAM) device. Thus, a height of the lower electrode has been increased for increasing a capacitance of the capacitor in a limited area.

However, the lower electrode may lean because of its high height. A pattern capable of supporting the lower electrode may reduce the leaning phenomenon, but a portion of the lower electrode that is not supported by the supporting pattern may bend.

SUMMARY

Embodiments of the inventive concept may provide semiconductor devices and methods for fabricating the same capable of suppressing a leaning phenomenon of a lower electrode of a capacitor.

Embodiments of the inventive concept may also provide semiconductor devices and methods for fabricating the same capable of sufficiently securing a capacitance.

In some embodiments, a semiconductor device may include: a plurality of capacitors disposed on a substrate, each of the capacitors including a lower electrode, an upper electrode, and a dielectric layer between the lower and upper electrodes; and a support pattern contacting sidewalls of the lower electrodes, the support pattern supporting upper portions and lower portions of the capacitors. Each of the lower electrodes may include: first electrode portion electrically connected to the substrate and having a solid shape, such as a pillar shape; and a second electrode portion stacked on the first electrode portion and having a shape comprising an opening therein, such as a cylinder shape. The support pattern may include: an upper pattern contacting sidewalls of top end portions of the lower electrodes; and a lower pattern vertically spaced apart from the upper pattern, the lower pattern contacting sidewalls under the top end portions of the lower electrodes. The planar shape of the upper pattern may be transferred to the lower pattern.

In an embodiment, the upper pattern may contact sidewalls of the second electrode portions; and the lower pattern may be vertically aligned with the upper pattern and may contact sidewalls of the first electrode portions.

In an embodiment, the lower pattern may be between the upper pattern and a position corresponding to a half of a height of the lower electrode from a bottom surface of the lower electrode.

In an embodiment, a thickness of the upper pattern may be substantially equal to or greater than a thickness of the lower pattern.

In an embodiment, a height of the second electrode portion may have a range of about one-third to about one-half of a height of the lower electrode.

In an embodiment, the second electrode portion may include a first sidewall and a second sidewall opposite the first sidewall. The first sidewall contacts the upper pattern. The second sidewall is spaced apart from the upper pattern.

In an embodiment, the first sidewall may have a height greater than that of the second sidewall.

In an embodiment, a top surface of the upper pattern may be at a level lower than a top end of the first sidewall of the second electrode portion.

In an embodiment, the first sidewall may have a thickness substantially equal to or greater than a thickness of the second sidewall.

In an embodiment, the lower pattern may contact a first sidewall of the first electrode portion. The first sidewall of the first electrode portion may be vertically aligned with the first sidewall of the first electrode portion. The lower pattern may not be in contact with or spaced apart from a second sidewall of the first electrode portion. The second sidewall of the first electrode portion may be vertically aligned with the second sidewall of the second electrode portion.

In other embodiments, a method of fabricating a semiconductor device may include: forming a mold stack on a substrate; forming a capacitor lower electrode penetrating the mold stack, the capacitor lower electrode being electrically connected to the substrate and having a hybrid structure including a solid shape and a shape having an opening therein; patterning the mold stack to form a support pattern including an upper pattern and a lower pattern vertically spaced apart from the upper pattern, the upper pattern supporting an upper portion of the capacitor lower electrode, the lower pattern supporting a lower portion of the capacitor lower electrode, and the lower pattern having substantially the same planar shape as the upper pattern; and sequentially forming a capacitor dielectric layer and a capacitor upper electrode on the capacitor lower electrode.

In an embodiment, forming the capacitor lower electrode may include: forming a capacitor-hole penetrating the mold stack; forming a first conductive layer filling the capacitor-hole and covering the mold stack; recessing the first conductive layer to form a first lower electrode filling a lower region of the capacitor-hole, the first lower electrode having the solid shape; forming a second conductive layer extending along an inner sidewall of the capacitor-hole and covering the mold stack; and patterning the second conductive layer to form a second lower electrode connected to the first lower electrode in an upper region of the capacitor-hole, the second lower electrode having the shape comprising an opening therein.

In an embodiment, forming the mold stack may include: sequentially forming a lower mold layer, a lower support layer, an upper mold layer, and an upper support layer on the substrate. At least one of the upper support layer and the lower support layer may have an etch selectivity with respect to at least one of the upper mold layer and the lower mold layer.

In an embodiment, forming the support pattern may include: patterning the upper support layer to form the upper pattern surrounding a sidewall of the second lower electrode and having an upper opening exposing a portion of the sidewall of the second lower electrode; and etching the lower support layer using the upper pattern as an etch mask to form the lower pattern surrounding a sidewall of the first lower electrode and having a lower opening exposing a portion of the sidewall of the first lower electrode.

In an embodiment, the method may further include: removing the upper mold layer by providing an etchant through the upper opening to form an upper space separating the upper pattern from the lower support layer; and removing the lower mold layer by providing an etchant through the lower opening to form a lower space separating the lower pattern from the substrate.

In an embodiment, a semiconductor device may comprise a plurality of capacitors on a substrate, each of the capacitors including a lower electrode, an upper electrode, and a dielectric layer between the lower and upper electrodes. Each of the lower electrodes may comprise a first electrode portion electrically connected to the substrate and having a solid shape and a second electrode portion stacked on the first electrode portion and having a shape comprising an opening therein. The device may further comprise a lower support pattern contacting sidewalls of the first electrode portion at a first position between a bottom surface of the second electrode portion and half of a height of the lower electrode from a bottom surface of the lower electrode. The device may also comprise an upper support pattern spaced apart from the lower support pattern and contacting sidewalls of the first electrode portion at a second position between a top surface of the second electrode portion.and half of a height of the second electrode portion from the bottom surface of the second electrode portion.

BRIEF DESCRIPTION OF THE DRAWINGS

The inventive concept will become more apparent in view of the attached drawings and accompanying detailed description.

DETAILED DESCRIPTION

Figure 1A:
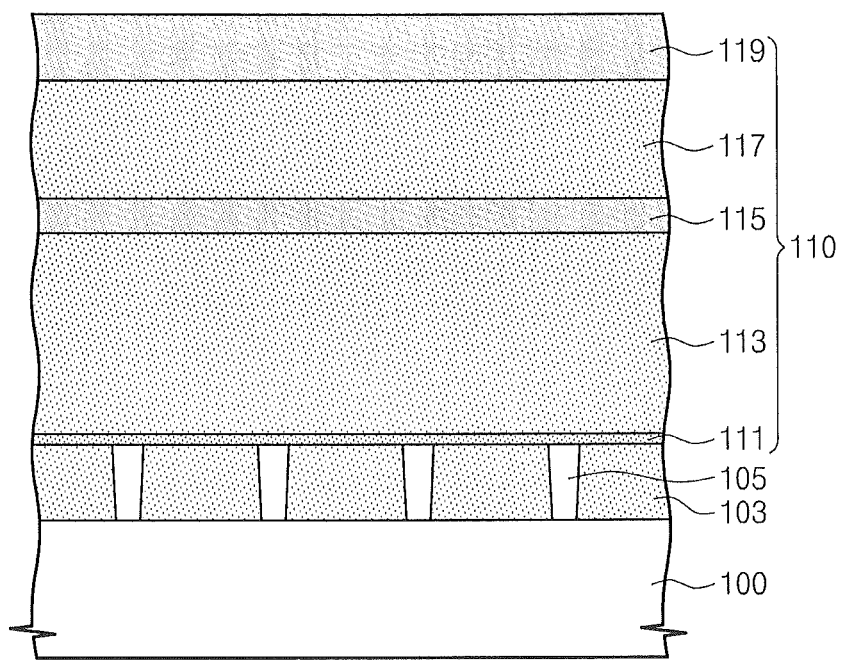
FIGS. 1A to 1L are cross-sectional views illustrating a method for fabricating a semiconductor device according to various embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

Additionally, the embodiments in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2A:
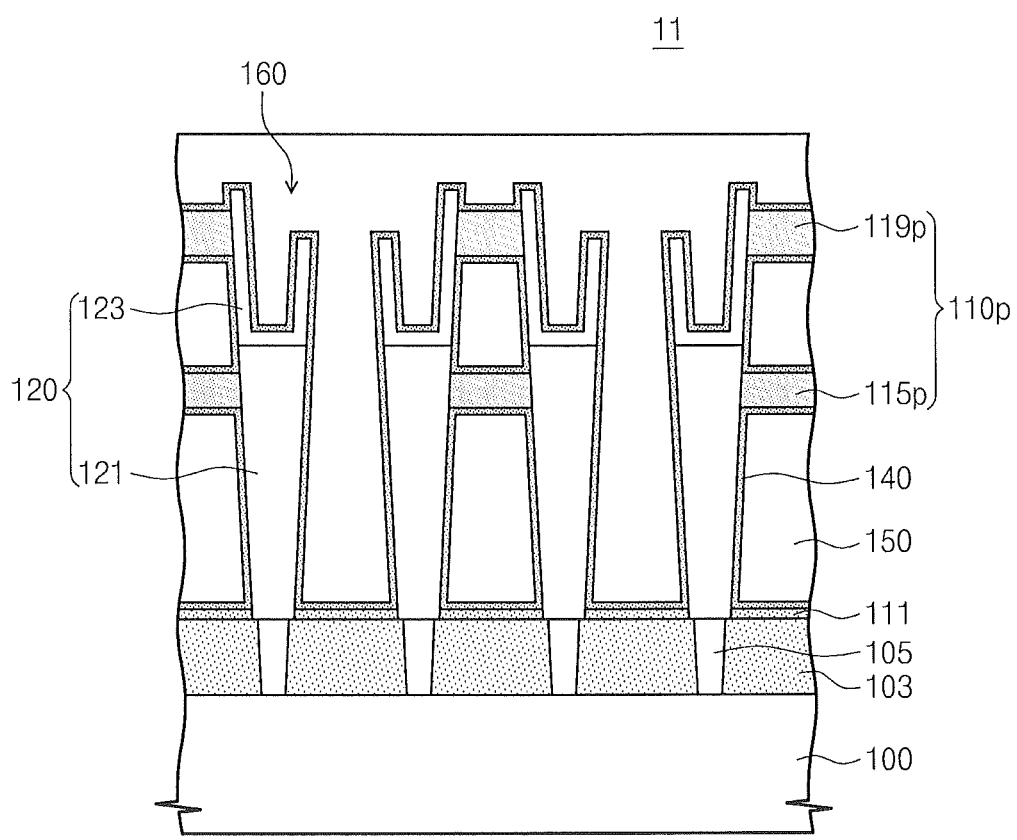
FIGS. 2A and 2B are cross-sectional views illustrating modified examples of FIG. 1L.
Figure 2B:
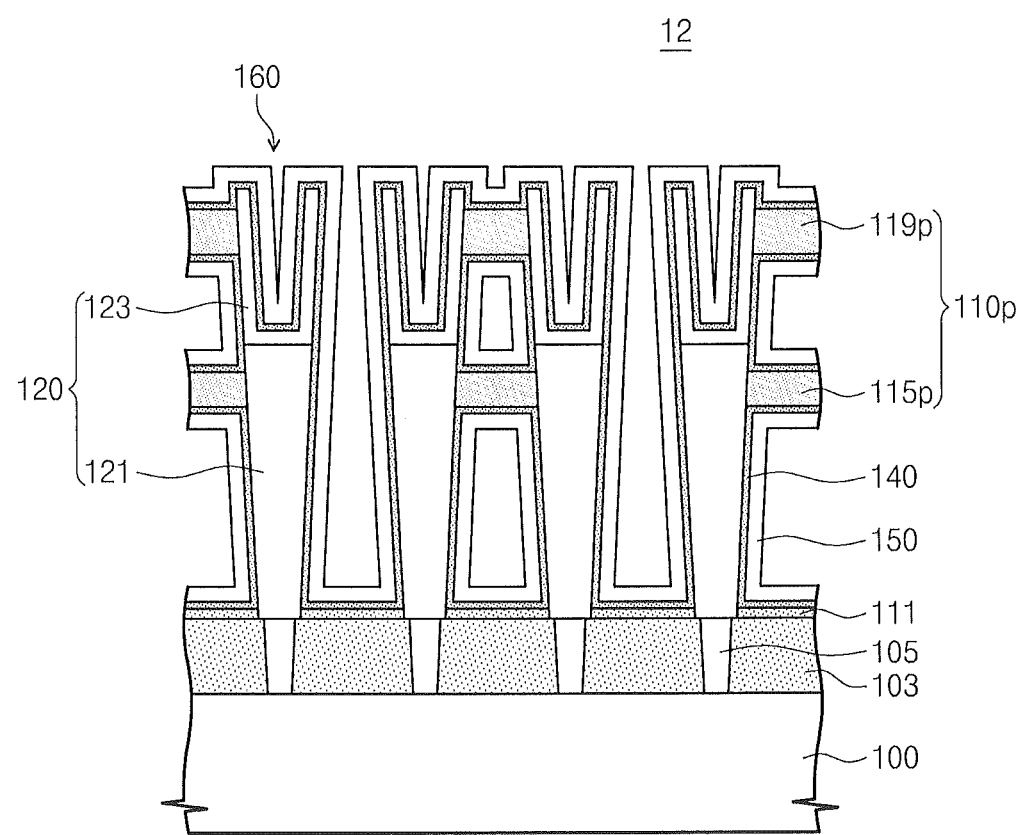
Figure 3A:
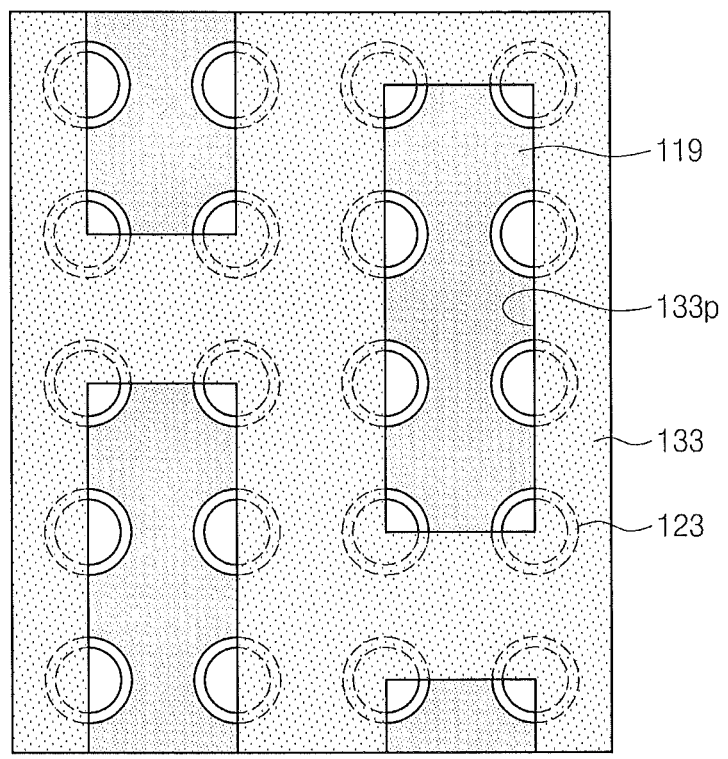
FIGS. 3A and 3B are plan views of FIG. 1G.
Figure 3B:
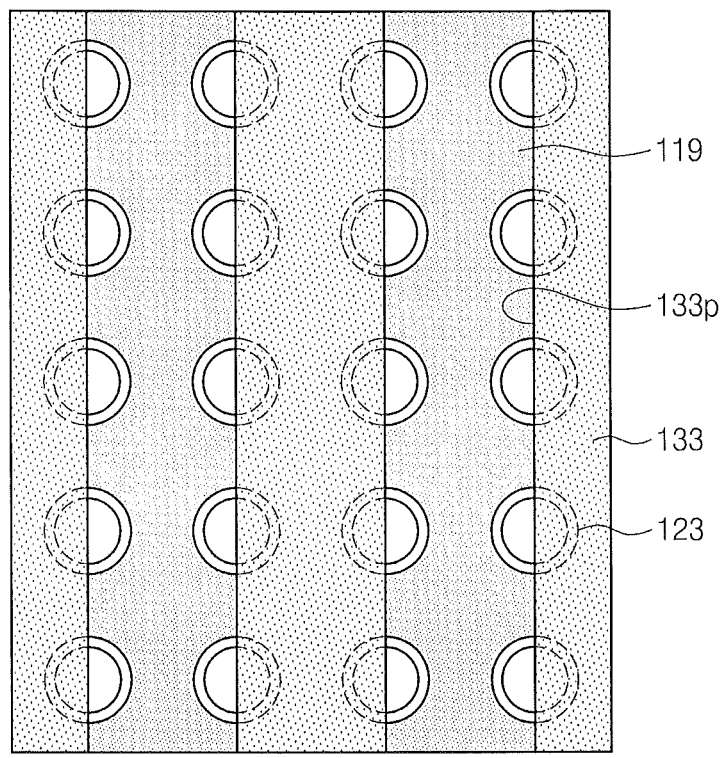
Figure 4A:
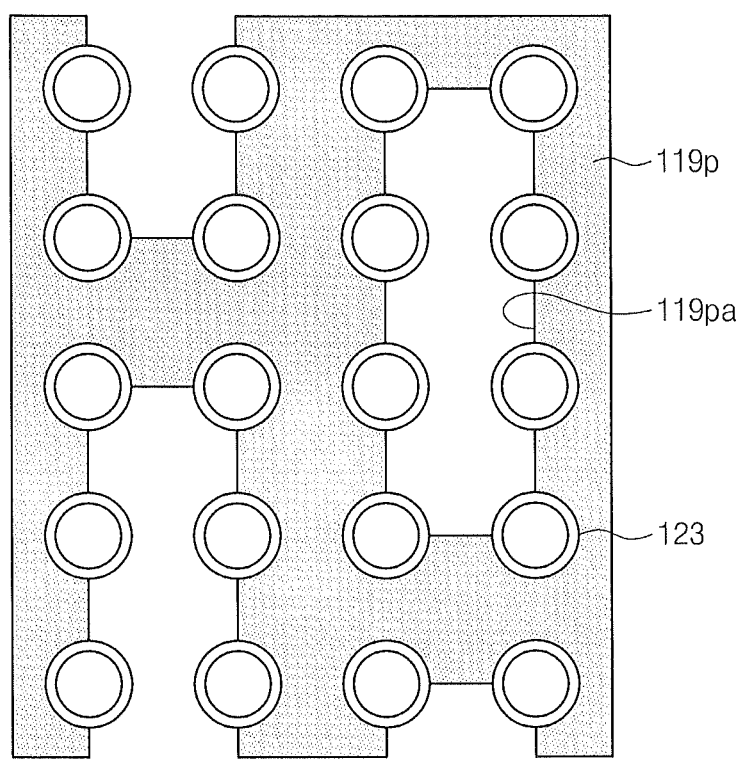
FIGS. 4A and 4B are plan views of FIG. 1H.
Figure 4B:
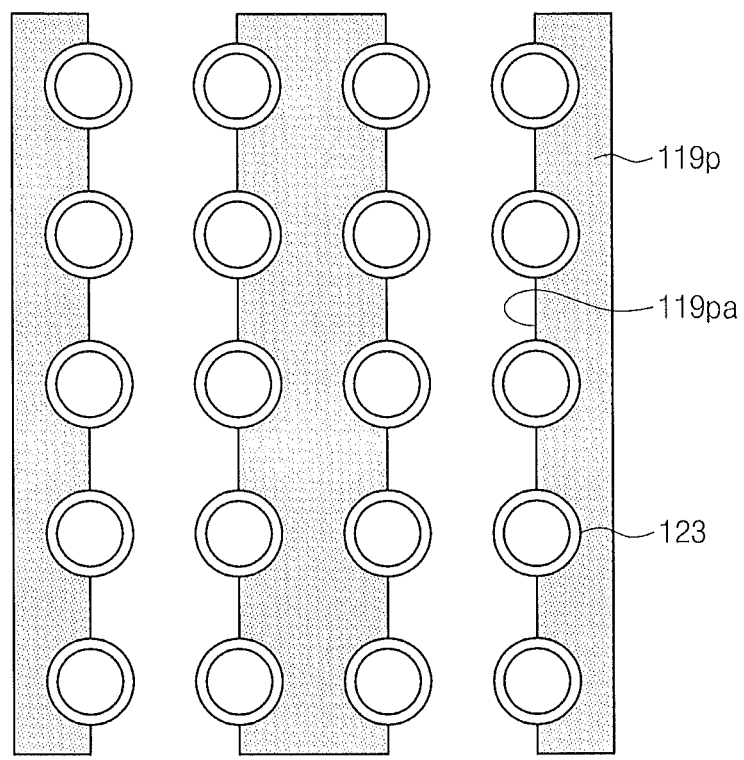

FIGS. 1A to 1L are cross-sectional views illustrating a method for fabricating a semiconductor device according to some embodiments of the inventive concept. FIGS. 2A and 2B are cross-sectional views illustrating modified examples of FIG. 1L. FIGS. 3A and 3B are plan views of FIG. 1G. FIGS. 4A and 4B are plan views of FIG. 1H.

Referring to FIG. 1A, a mold stack 110 may be formed on a substrate 100. The substrate 100 may include a semiconductor substrate such as a silicon wafer. A plurality of word lines and a plurality of bit lines may be provided on the substrate 100. An interlayer insulating layer 103 may cover the word lines and the bit lines. Junction regions may be provided in the substrate 100 at both sides of the word line. Contact plugs 105 may vertically penetrate the interlayer insulating layer 103. The contact plugs 105 may be electrically connected to the junction regions.

The mold stack 110 may include a plurality of insulating layers having an etch selectivity with respect to each other. In an embodiment, the mold stack 110 may include a lower mold layer 113, a lower support layer 115, an upper mold layer 117, and an upper support layer 119 that are sequentially stacked on the interlayer insulating layer 103. The lower mold layer 113 and the upper mold layer 117 may be formed of oxide layers (e.g., silicon oxide layers) by a deposition method. The lower support layer 115 and the upper support layer 119 may be formed of nitride layers (e.g., silicon nitride layers) by a deposition method. Alternatively, the lower and upper mold layers 113 and 117 may be formed of nitride layers (e.g., silicon nitride layers), and the lower and upper support layers 115 and 119 may be formed of oxide layers (e.g., silicon oxide layers). In an embodiment, the mold stack 110 may further include an etch stop layer 111. For example, the etch stop layer 111 may be formed on the interlayer insulating layer 103 before the lower mold layer 113 is formed. The etch stop layer 111 may be formed of a nitride layer (e.g., a silicon nitride layer) by a deposition method. A thickness of the upper mold layer 117 may be equal to or different from a thickness of the lower mold layer 113. Likewise, a thickness of the upper support layer 119 may be equal to or different from a thickness of the lower support layer 115. In an embodiment, the upper support layer 119 may be formed to be thicker than the lower support layer 115. The upper mold layer 117 may be formed to be thinner than the lower mold layer 113.

Figure 1B:
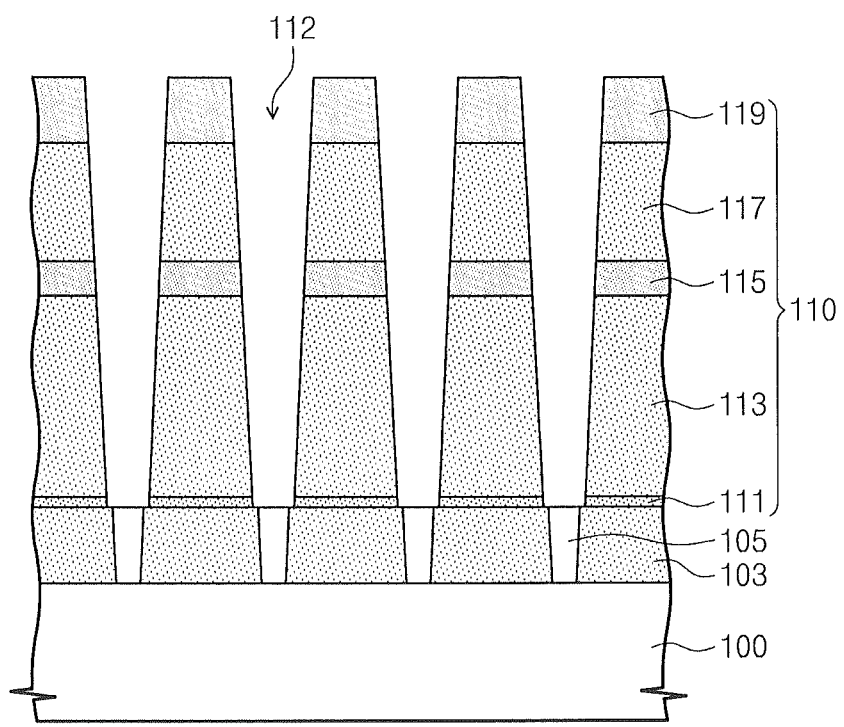

Referring to FIG. 1B, capacitor-holes 112 may be formed. The capacitor-holes 112 may vertically penetrate the mold stack 110 and may expose the contact plugs 105, respectively. The capacitor-holes 112 may be formed using a wet etching process and/or a dry etching process. Each of the capacitor-holes 112 may have one of various shapes such as a circular shape, an elliptical shape, and a polygonal shape in a plan view. A sidewall of each of the capacitor-holes 112 may be inclined or be vertical to a top surface of the substrate 100. However, the inventive concept is not limited thereto. In an embodiment, the mold stack 110 may be dry-etched to form the capacitor-hole 112 having a hollow cylindrical shape of which a planar area becomes progressively less toward a bottom thereof. In an embodiment, the upper support layer 119, the upper mold layer 117, the lower support layer 115, and the lower mold layer 113 may be partially removed by the dry etching process to expose the etch stop layer 111, and then the exposed etch stop layer 111 may be patterned to form the capacitor-holes 112 exposing the contact plugs 105, respectively. The etch stop layer 111 may protect/prevent the interlayer insulating layer 103 and the contact plugs 105 from being damaged by the dry etching process.

Figure 1C:
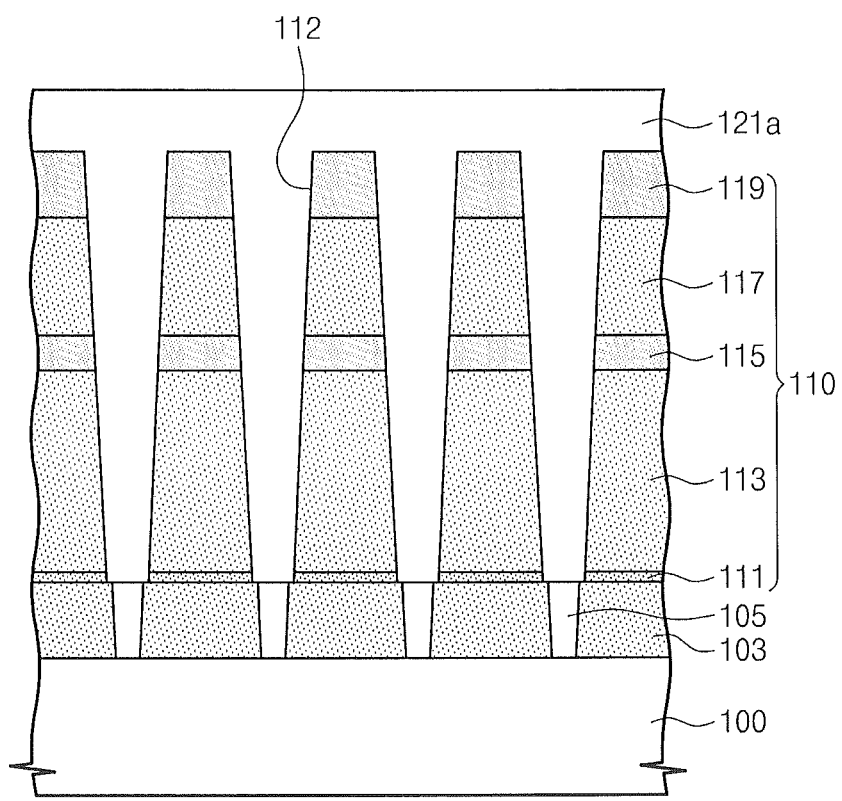

Referring to FIG. 1C, a first lower electrode layer 121a may be formed to cover the mold stack 110. A conductive material (e.g., doped poly-silicon, a metal, and/or a metal nitride) may be deposited by a chemical vapor deposition (CVD) process or a physical vapor deposition (PVD) process to form the first lower electrode layer 121a. In an embodiment, the first lower electrode layer 121a may include titanium (Ti), titanium nitride (TiN), or titanium/titanium nitride (Ti/TiN). The first lower electrode layer 121a may fill the capacitor-holes 112, so as to be connected to the contact plugs 105.

Figure 1D:
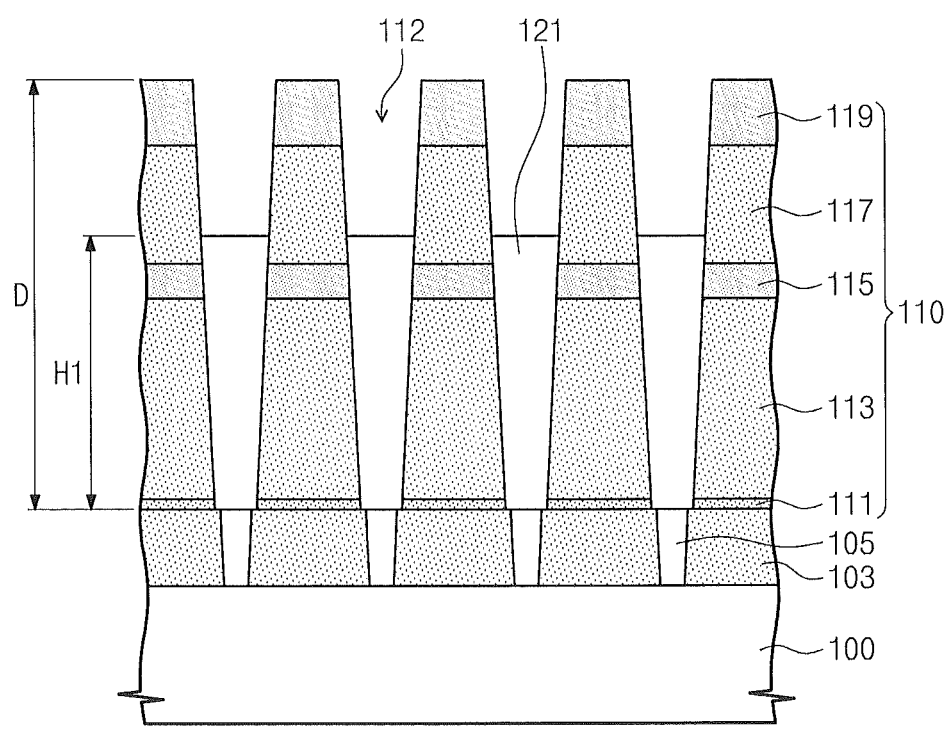

Referring to FIG. 1D, first lower electrodes 121 may be formed. In an embodiment, the first lower electrode layer 121a may be selectively etched by an etch-back process having an etch selectivity with respect to the materials (e.g., silicon oxide and silicon nitride) constituting the mold stack 110. The first lower electrode layer 121 may be recessed by the etch-back process, thereby forming the first lower electrodes 121 of pillar-shapes partially filling the capacitor-holes 112. A height H1 of the first lower electrode 121 may have a range of about one-half ($\frac{1}{2}$) to about two-thirds ($\frac{2}{3}$) of a depth D of the capacitor-hole 112 (i.e., a height of the mold stack 110). In other words, about one-half to about two-thirds of the capacitor-hole 112 may be filled with the first lower electrode 121.

Figure 1E:
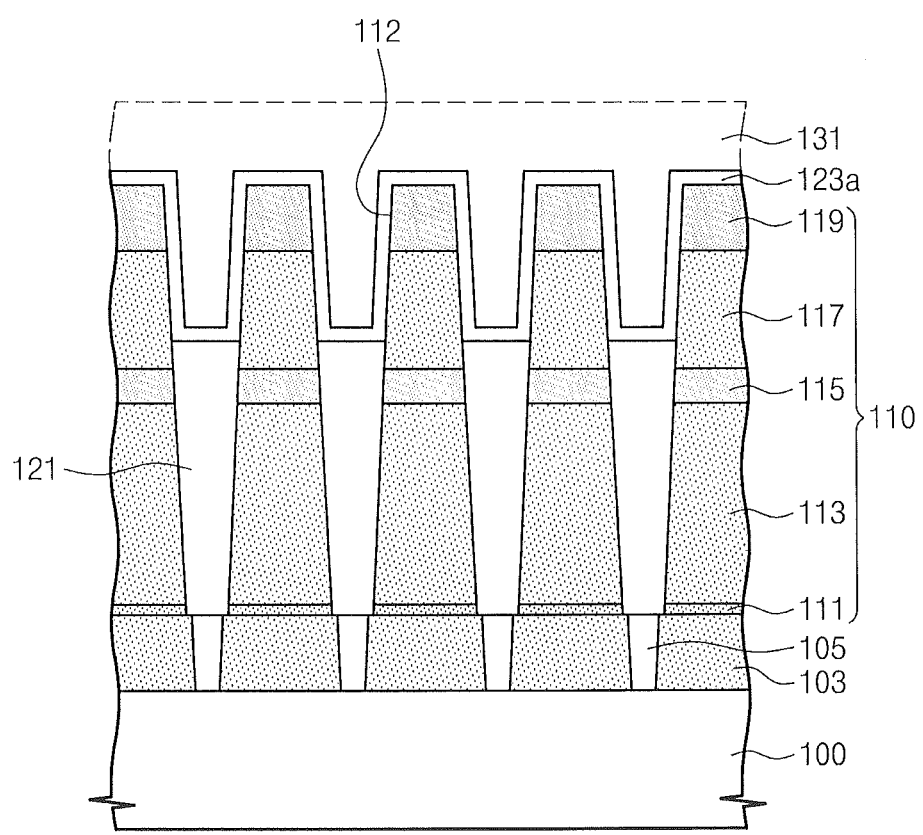

Referring to FIG. 1E, a second lower electrode layer 123a may be formed. The second lower electrode layer 123a may not completely fill the capacitor-holes 112. The second lower electrode layer 123a may extend along a profile of the mold stack 110. In an embodiment, the second lower electrode layer 123a may cover sidewalls and bottom surfaces (i.e., top surfaces of the first lower electrodes 121) of the capacitor-holes 112 and may extend onto a top surface of the upper support layer 119. Thus, the second lower electrode layer 123a may have a continuous thin layer shape. The second lower electrode layer 123a may be formed by depositing a conductive material such as doped poly-silicon, a metal, and/or a metal nitride. In an embodiment, the second lower electrode layer 123a may include titanium (Ti), titanium nitride (TiN), or titanium/titanium nitride (Ti/TiN). Additionally, a capping layer 131 covering the mold stack 110 may be further formed to completely fill the capacitor-holes 112. The capping layer 131 may be formed by depositing, for example, an oxide layer (e.g., a silicon oxide layer).

Figure 1F:
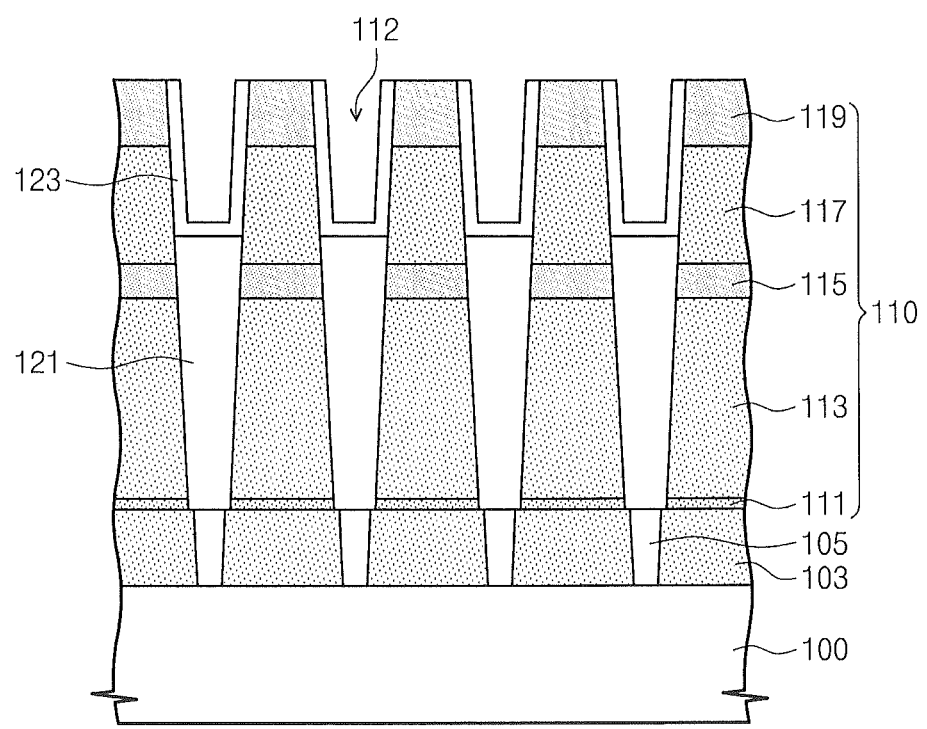

Referring to FIG. 1F, second lower electrodes 123 may be formed. For example, the second lower electrode layer 123a may be partially removed by an etch-back process or a chemical mechanical polishing (CMP) process until the upper support layer 119 is exposed. Thus, the second electrode layer 123a may be node-separated to form the plurality of second lower electrodes 123 of cylindrical shapes. The second lower electrodes 123 may be connected to the first lower electrodes 121, respectively. If the capping layer 131 is formed, the capping layer 131 and the second lower electrode layer 123a may be planarized by the etch-back process or the CMP process until the upper support layer 119 is exposed, thereby forming the second lower electrodes 123. Thereafter, the capping layer 131 may be removed or may remain.

Figure 1G:
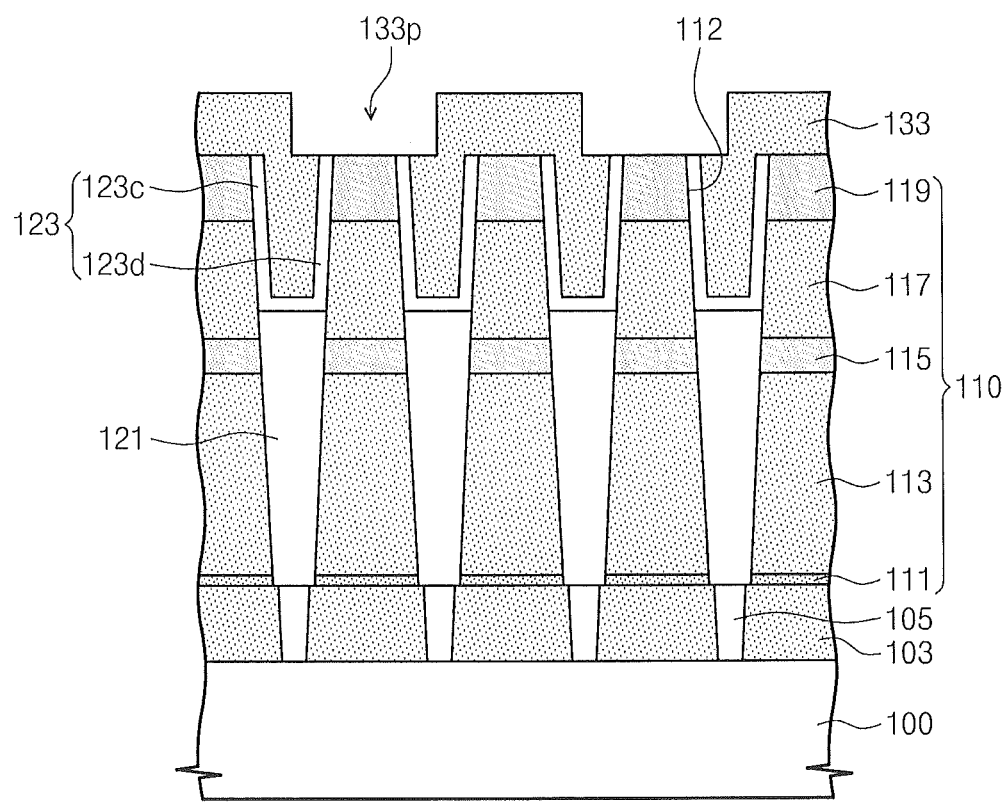

Referring to FIG. 1G, a mask 133 may be formed on the mold stack 110. The mask 133 may have a net or mesh shape including opening patterns 133p. Each of the opening patterns 133p may have an island shape exposing the upper support layer 119 between the second lower electrodes 123 adjacent to each other. In an embodiment, a planar shape of the opening pattern 133p may have a quadrilateral shape as illustrated in FIG. 3A. In another embodiment, the mask 133 may have linear-shaped opening patterns 133p exposing the upper support layer 119 as illustrated in FIG. 3B. In an embodiment, an oxide layer (e.g., a silicon oxide layer) may be deposited to fill the capacitor-holes 112 and then the deposited oxide layer may be patterned to form the mask 133. In another embodiment, a photoresist may be coated and then be patterned to form the mask 133. A first portion 123c of the second lower electrode 121 may be covered by the mask 133, and a second portion 123d may be exposed by the opening pattern 133p.

Figure 1H:
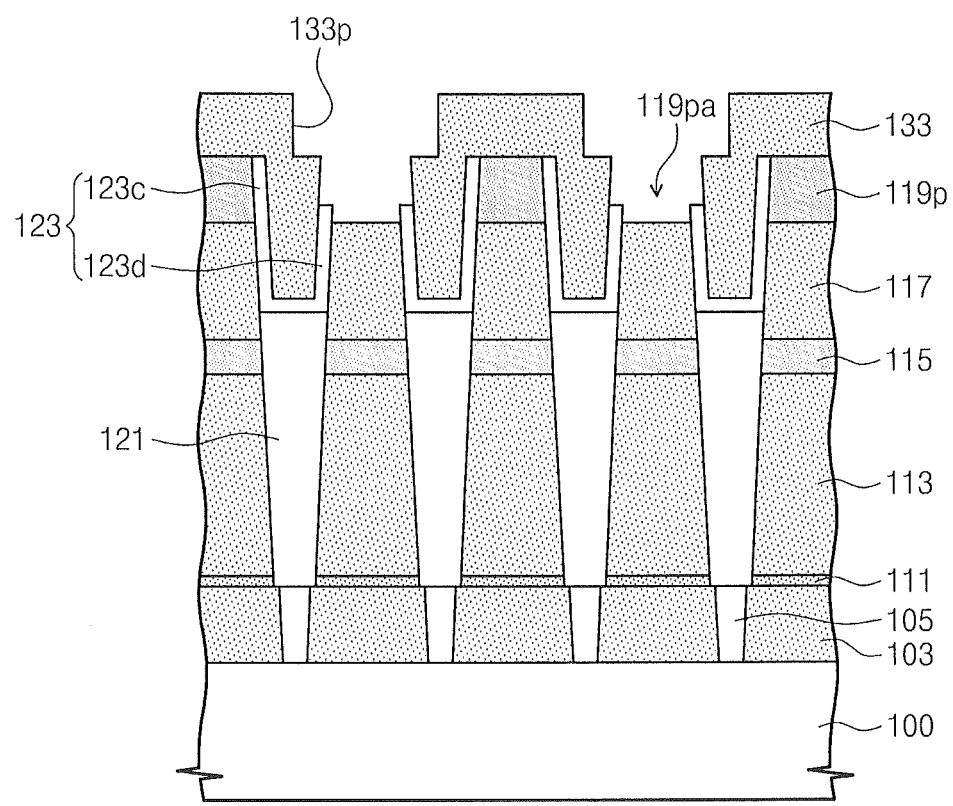

Referring to FIG. 1H, an upper support pattern 119p may be formed. The upper support layer 119 exposed by the opening patterns 133p may be etched by an etching process using the mask 133 as an etch mask, thereby forming the upper support pattern 119p. In an embodiment, if the upper support layer 119 is formed of a silicon nitride layer, the upper support layer 119 may be patterned using a wet or dry etching process providing an etchant capable of selectively removing the silicon nitride layer, so that the upper support pattern 119p may be formed. The upper support pattern 119p may have a net or mesh shape including line patterns that extend along the top surface of the substrate 100 and cross each other, as illustrated in FIG. 4A. In another embodiment, the upper support pattern 119p may have a line-type shape including line patterns that extend along the top surface of the substrate 100 and are parallel to each other, as illustrated in FIG. 4B.

The upper support pattern 119p may include upper openings 119pa exposing the upper mold layer 117, as illustrated in FIG. 4A. A planar shape of the upper opening 119pa may be a quadrilateral shape. In another embodiment, the upper opening 119pa may have a linear shape, as illustrated in FIG. 4B. When the upper support pattern 119p is formed, sidewalls of the second lower electrodes 123 exposed by the opening patterns 133p may be recessed. Thus, the second portion 123d of the second lower electrode 123, which is not in contact with the upper support pattern 119p, may be lower than the first portion 123c of the second lower electrode 123, which contacts the upper support pattern 119p.

Figure 1I:
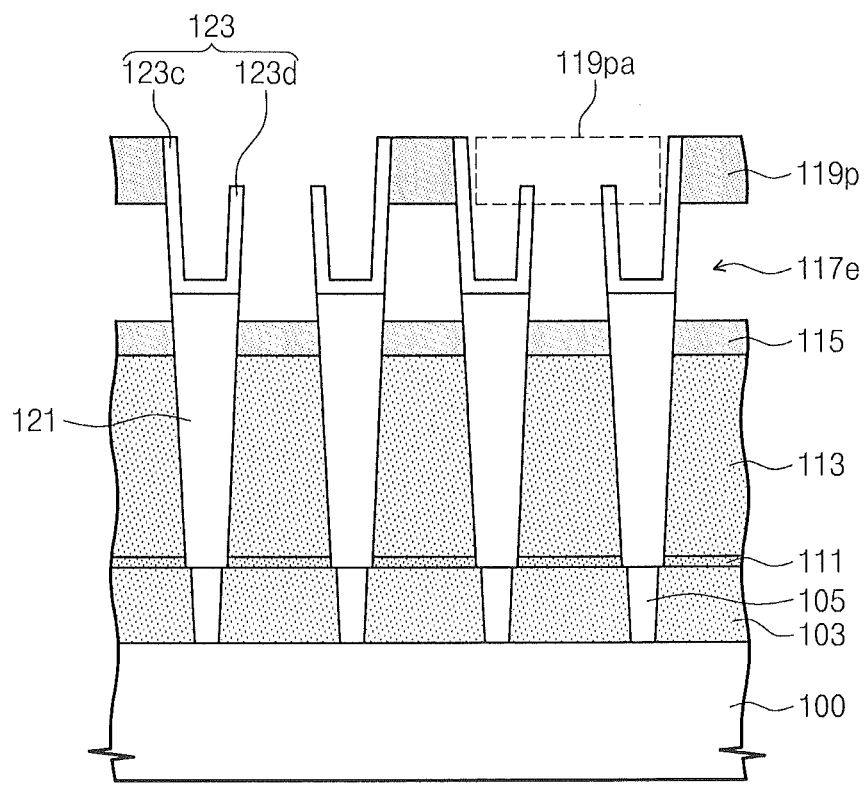

Referring to FIG. 1I, the lower support layer 115 may be exposed. In an embodiment, the mask 133 and the upper mold layer 117 may be removed to expose the lower support layer 115. An etchant capable of selectively removing the upper mold layer 117 may be provided through the upper opening 119pa, so that the upper mold layer 117 may be wet-etched or dry-etched to be removed. According to the present embodiment, the upper mold layer 117 and the mask 133 may be formed of an oxide (e.g., silicon oxide). Thus, the mask 133 and the upper mold layer 117 may be removed by a LAL lift-off process using a LAL solution including ammonium fluoride ($NH_4F$), hydrofluoric acid (HF), and water. The upper mold layer 117 may be removed to form an upper space 117e exposing the lower support layer 115 between the upper support pattern 119p and the lower supper layer 115. The upper space 117e may further expose a portion of the first lower electrode 121.

Figure 1J:
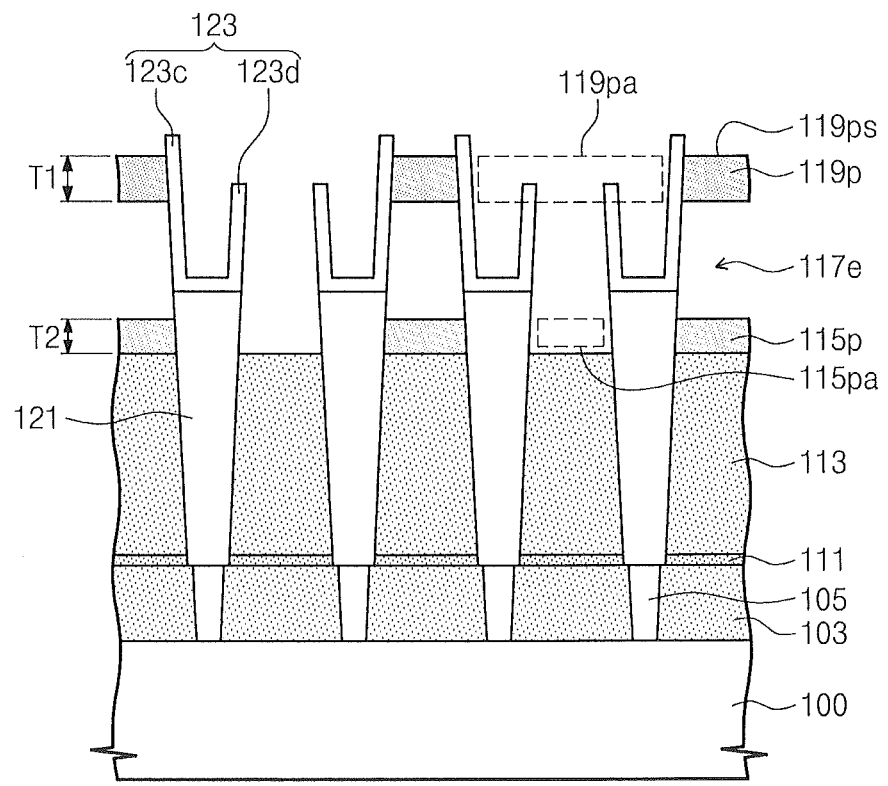

Referring to FIG. 1J, a lower support pattern 115p may be formed. The lower support pattern 115p may be formed by an etching process using the upper support pattern 119p as an etch mask. For example, the lower support layer 115 may be patterned by a wet or dry etching process using an etchant provided through the upper opening 119pa to form the lower support pattern 115p. The lower support pattern 115p may have the same shape as or a similar shape to the upper support pattern 119p. According to the present embodiment, the planar shape of the upper support pattern 119p may be transferred to the lower support layer 115 without a photolithography process, so that the lower support pattern 115p may be formed to have a mesh or line-type shape. The lower support pattern 115p may have a lower opening 115pa vertically aligned with the upper opening 119pa. The lower opening 115pa may have the same planar shape as or a similar planar shape to the upper opening 119pa. For example, the lower opening 115pa may have a quadrilateral shape or a linear shape. The lower opening 115pa may expose the lower mold layer 113.

Since the etchant may attack the upper support pattern 119p during the formation of the lower support pattern 115p, a portion (e.g., an upper portion) of the upper support pattern 119p may be etched or recessed, such that a thickness of the upper support pattern 119p may be reduced. Thus, a top surface 119ps of the upper support pattern 119p may be lower than a top end of the first portion 123c of the second lower electrode 123. An etching amount of the upper support pattern 119p may be varied by an etch rate of the upper support pattern 119p. In an embodiment, if the upper support pattern 119p and the lower support pattern 119p are formed of the same material (e.g., silicon nitride), the upper support layer 119 may be formed to be thicker than the lower support layer 115 in due consideration of the etching amount and/or an etching margin. Thus, the upper support pattern 119p may have a thickness T1 substantially equal to or greater than a thickness T2 of the lower supper pattern 115p.

Figure 1K:
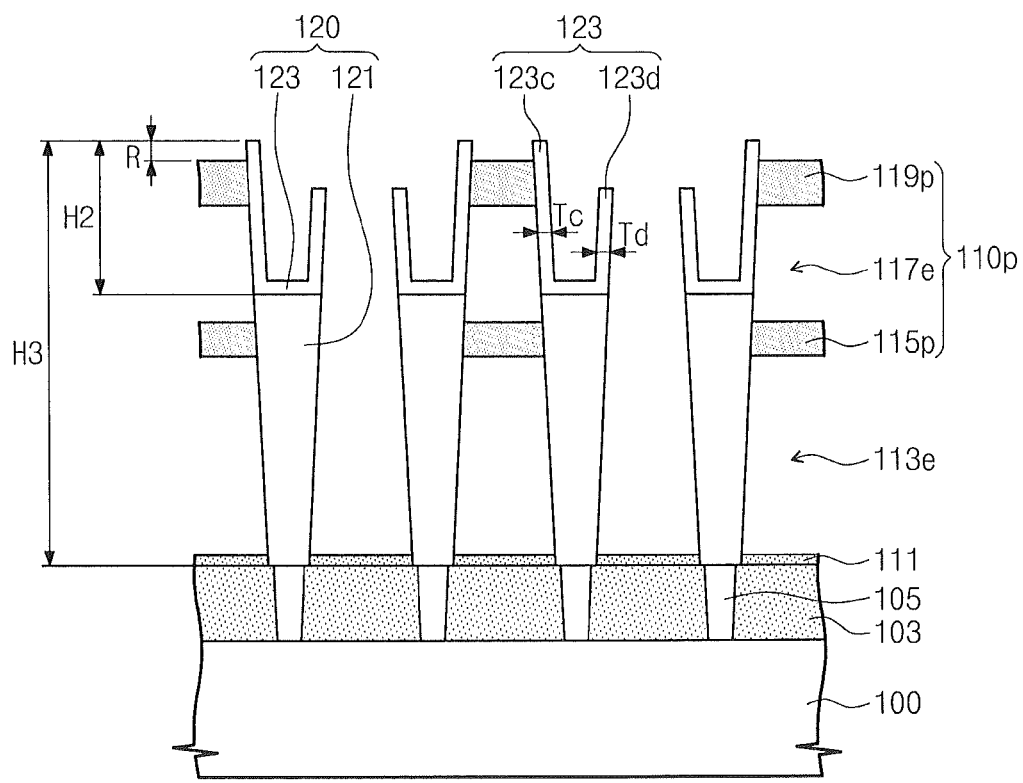

Referring to FIG. 1K, the lower mold layer 113 may be removed. For example, an etchant capable of selectively removing the lower mold layer 113 may be provided through the lower opening 115pa to remove the lower mold layer 113 in a wet or dry etching process. According to an embodiment, the lower mold layer 113 may be formed of an oxide layer (e.g., a silicon oxide layer), such that the lower mold layer 113 may be removed by the LAL lift-off process. The lower mold layer 113 may be removed to form a lower space 113e separating the lower support pattern 115p from the substrate 100 (or the interlayer insulating layer 103). The lower space 113e may further expose a sidewall of the first lower electrode 121. A capacitor lower electrode 120 having a hybrid structure may be formed through the processes described above. The hybrid structure may include the first lower electrode 121 of a pillar shape and the second lower electrode 123 of the cylinder shape stacked on the first lower electrode 121. The capacitor lower electrode 120 may be firmly supported by a multi-support pattern 110p. The multi-support pattern 110p may include the lower support pattern 115p that supports the first lower electrode 121 and the upper support pattern 119p that supports the second lower electrode 123.

For example, a height H2 of the second lower electrode 123 may have a range of about one-third to about one-half of a height H3 of the capacitor lower electrode 120. If the height H3 of the capacitor lower electrode 120 is about 15,000 Å, the height H2 of the second lower electrode 123 may be within a range of about 5,000 Å to about 7,500 Å. As described above with reference to FIG. 1J, the upper support pattern 119p may be recessed. For example, the upper support pattern 119p may be recessed by a thickness R of about 1,500 Å or less. However, the inventive concept is not limited thereto. The capacitor lower electrode 120 may become tapered toward the substrate 100. For example, a size (or a critical dimension) of a bottom portion of the capacitor lower electrode 120 may be within a range of about 20 nm to about 30 nm, and a size (or a critical dimension) of a top portion of the capacitor lower electrode 120 may be within a range of about 30 nm to about 50 nm. The lower support pattern 115p may be disposed at a level equal to or higher than a half of the height of the capacitor lower electrode 120 from the bottom surface of the capacitor lower electrode 120. The second portion 123d of the second lower electrode 123 which is not in contact with the upper support pattern 119p may be more etched than the first portion 123c by the etchant in the etching process. Thus, a thickness Td of the second portion 123d of the second lower electrode 123 which is not in contact with the upper support pattern 119p may be smaller than a thickness of Tc of the first portion 123c of the second lower electrode 123 which contacts the upper support pattern 119p. Alternatively, the thickness Td of the second portion 123d of the second lower electrode 123 may be equal to or similar to the thickness Tc of the first portion 123c of the second lower electrode 123.

Figure 1L:
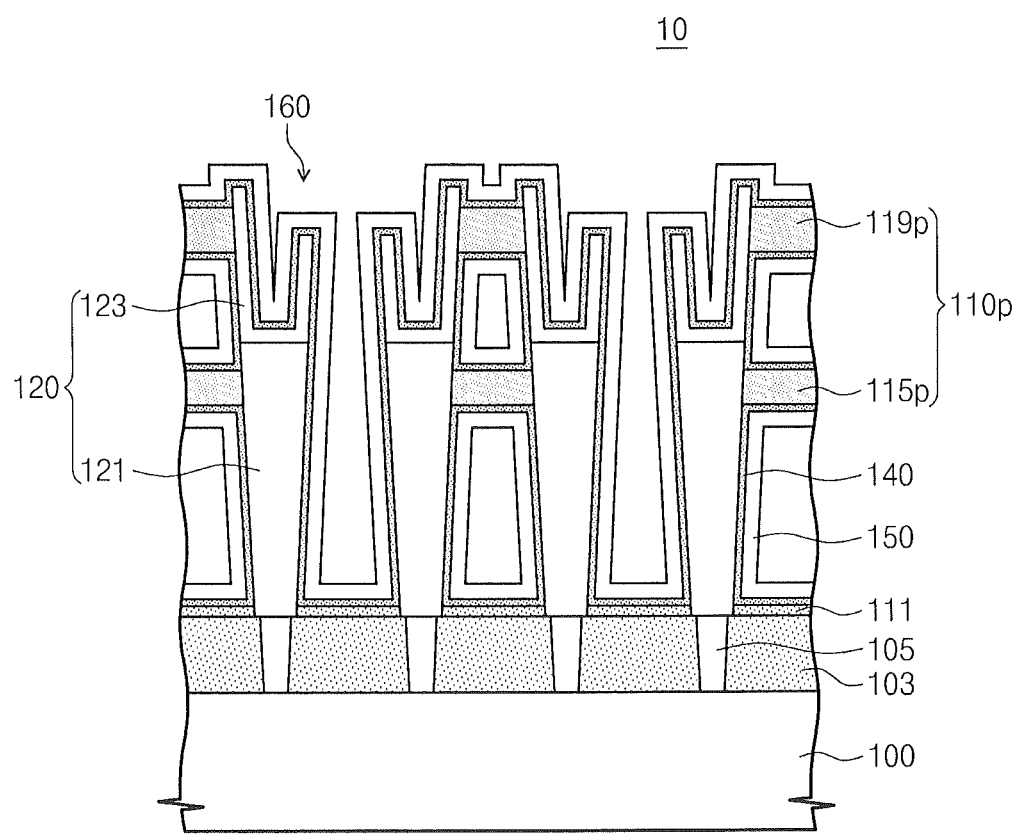

Referring to FIG. 1L, a capacitor dielectric layer 140 may be formed to cover the capacitor lower electrode 120, and then a capacitor upper electrode 150 may be formed to cover the capacitor dielectric layer 140. Thus, a semiconductor device 10 (e.g., a DRAM device) including a capacitor 160 of a hybrid structure may be fabricated. The capacitor dielectric layer 140 may further cover the multi-support pattern 110p. The capacitor dielectric layer 140 may be formed of a hafnium oxide (e.g., $HfO_2$) layer by a deposition method. The capacitor upper electrode 150 may extend along a profile of the capacitor lower electrode 120. The capacitor upper electrode 150 may be formed of doped poly-silicon, a metal, and/or a metal nitride by a deposition method. For example, the capacitor upper electrode 150 may include titanium (Ti), titanium nitride (TiN), or titanium/titanium nitride (Ti/TiN). Since the capacitor 160 includes the second lower electrode 123 having a wide surface area, the capacitance of the capacitor 160 may be sufficiently secured.

In other embodiments, there may be fabricated a semiconductor device 11 including the capacitor upper electrode 150 which fills spaces between the adjacent capacitor lower electrodes 120, as illustrated in FIG. 2A. In still other embodiments, there may be fabricated a semiconductor device 12 including the second lower electrode 123 which has a substantially uniform height, as illustrated in FIG. 2B.

Figure 5A:
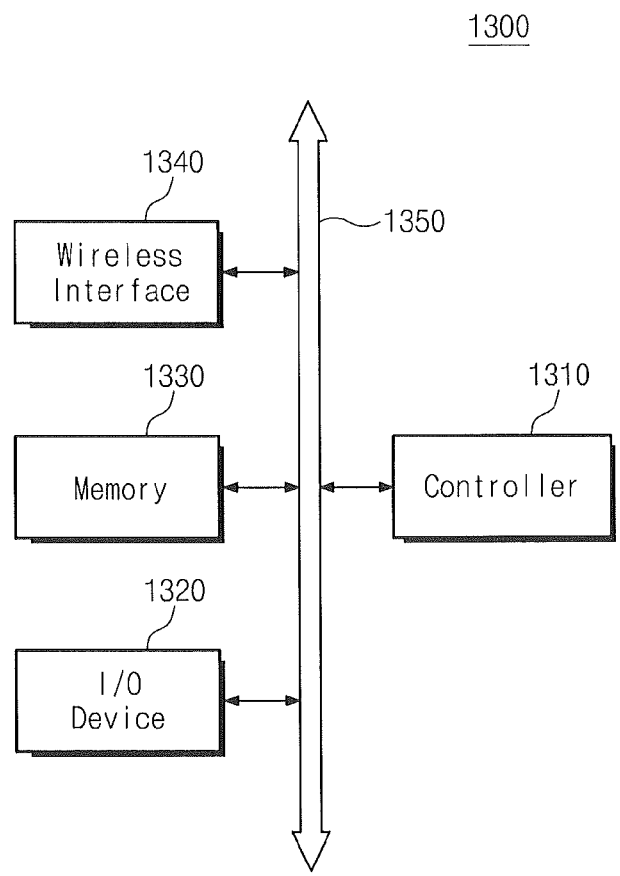
FIGS. 5A and 5B are schematic block diagrams illustrating application examples of a semiconductor device according to various embodiments of the inventive concept.
Figure 5B:
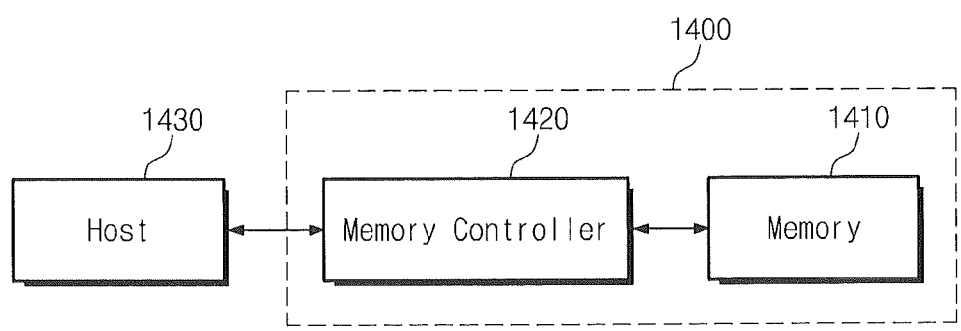

FIGS. 5A and 5B are schematic block diagrams illustrating application examples of a semiconductor device according to some embodiments of the inventive concept.

Referring to FIG. 5A, an electronic device 1300 may include at least one of the semiconductor devices 10, 11, and 12 according to embodiments of the inventive concept. The electronic device 1300 may be used in wireless communication devices such as a personal digital assistant (PDA), a laptop computer, a portable computer, web tablet, a wireless phone, a mobile phone, a digital music player, and/or other devices capable of transmitting and/or receiving data in a wireless environment. The electronic device 1300 may include a controller 1310, an input/output (I/O) unit 1320 (e.g., a keypad, a keyboard and/or a display), a memory device 1330, and wireless interface unit 1340 which are combined with each other through a data bus 1350. For example, the controller 1310 may include at least one of a microprocessor, a digital signal processor, a microcontroller or other logic devices. The other logic devices may have a similar function to any one of the microprocessor, the digital signal processor and the microcontroller. The memory device 1330 may store, for example, commands performed by the controller 1310. The memory device 1330 may include at least one of the semiconductor devices 10, 11, and 12 according to embodiments of the inventive concept. The electronic device 1300 may use the wireless interface unit 1340 for transmitting data to a wireless communication network communicating with a radio frequency (RF) signal or for receiving data from the network. For example, the wireless interface unit 1340 may include an antenna or a wireless transceiver. The electronic device 1300 according to the embodiments of inventive concept may be used in a communication interface protocol such as a third generation communication system (e.g., CDMA, GSM, NADC, E-TDMA, WCDAM, and/or CDMA2000).

Referring to FIG. 5B, a memory system 1400 may include at least one of the semiconductor devices 10, 11, and 13 according to embodiments of the inventive concept. The memory system 1400 may include a memory controller 1420 and a memory device 1410 for storing massive data. The memory controller 1420 may read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices 10, 11, and 12 according to the above embodiments of the inventive concept.

According to embodiments of the inventive concept, the support pattern supporting the capacitor lower electrode is formed to have a double structure capable of supporting the lower portion and the upper portion of the capacitor lower electrode. Thus, a leaning phenomenon of the capacitor lower electrode may be minimized or prevented. Additionally, the processes of forming the support pattern of the double structure may be simplified to reduce process costs of the semiconductor device. Moreover, the capacitor lower electrode has the hybrid structure including the pillar structure and the cylinder structure, such that the capacitance of the capacitor may be sufficiently secured to improve electrical characteristics of the semiconductor device.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   a plurality of capacitors on a substrate, each of the capacitors including a lower electrode, an upper electrode, and a dielectric layer between the lower and upper electrodes; and
   a support pattern contacting sidewalls of the lower electrodes, the support pattern supporting upper portions and lower portions of the capacitors,
   wherein each of the lower electrodes comprises:
      a first electrode portion on the dielectric layer, electrically connected to and spaced apart from the substrate, and having a solid shape; and
      a second electrode portion stacked on the first electrode portion and having a shape comprising an opening therein,
   wherein the support pattern comprises:
      an upper pattern contacting sidewalls of top end portions of the lower electrodes; and
      a lower pattern vertically spaced apart from the upper pattern, the lower pattern contacting sidewalls under the top end portions of the lower electrodes.

2. The semiconductor device of claim 1, wherein the upper pattern contacts a sidewall of the second electrode portion; and
   wherein the lower pattern is vertically aligned with the upper pattern and contacts a sidewall of the first electrode portion, and wherein a planar shape of the lower pattern corresponds to a planar shape of the upper pattern.

3. The semiconductor device of claim 1, wherein the lower pattern is between the upper pattern and a position corresponding to a half of a height of the first electrode portion from a bottom surface of the first electrode portion.

4. The semiconductor device of claim 1, wherein a thickness of the upper pattern is substantially equal to or greater than a thickness of the lower pattern.

5. The semiconductor device of claim 1, wherein a height of the second electrode portion has a range of about one-third to about one-half of a height of the lower electrode.

6. The semiconductor device of claim 1, wherein the second electrode portion comprises a first sidewall and a second sidewall opposite the first sidewall,
wherein the first sidewall contacts the upper pattern and the second sidewall is spaced apart from the upper pattern.

7. The semiconductor device of claim 6, wherein the first sidewall has a height greater than that of the second sidewall.

8. The semiconductor device of claim 6, wherein a top surface of the upper pattern is at a level lower than a top end of the first sidewall of the second electrode portion.

9. The semiconductor device of claim 6, wherein the first sidewall has a thickness substantially equal to or greater than a thickness of the second sidewall.

10. The semiconductor device of claim 6,
wherein the dielectric layer and the lower pattern contact a first sidewall of the first electrode portion, the first sidewall of the first electrode portion being vertically aligned with the first sidewall of the second electrode portion; and
wherein the lower pattern is spaced apart from a second sidewall of the first electrode portion, the second sidewall of the first electrode portion being vertically aligned with the second sidewall of the second electrode portion.

11. A semiconductor device comprising:
a plurality of capacitors on a substrate, each of the capacitors including a lower electrode, an upper electrode, and a dielectric layer between the lower and upper electrodes wherein each of the lower electrodes comprises:
a first electrode portion on the dielectric layer, electrically connected to and spaced apart from the substrate, and having a solid shape; and
a second electrode portion stacked on the first electrode portion and having a shape comprising an opening therein;
a lower support pattern contacting sidewalls of the first electrode portion at a first position between a bottom surface of the second electrode portion and half of a height of the first electrode portion from a bottom surface of the first electrode portion; and
an upper support pattern spaced apart from the lower support pattern and contacting sidewalls of the second electrode portion at a second position between a top surface of the second electrode portion and half of a height of the second electrode portion from the bottom surface of the second electrode portion.

12. The semiconductor device of claim 11, wherein the upper support pattern is vertically aligned with the lower support pattern.

13. The semiconductor device of claim 11, wherein the second electrode portion comprises a first sidewall and a second sidewall opposite the first sidewall,
wherein the first sidewall contacts the upper support pattern and the second sidewall is spaced apart from the upper support pattern.

14. The semiconductor device of claim 11, wherein a thickness of the lower support pattern is substantially equal to a thickness of the upper support pattern.

15. The semiconductor device of claim 11, wherein a thickness of the lower support pattern is less than a thickness of the upper support pattern.

16. A semiconductor device comprising:
a capacitor comprising a dielectric layer between first and second electrodes, the first electrode comprising first and second portions thereof, wherein the second portion of the first electrode is on the first portion of the first electrode, and wherein the dielectric layer is on first and second sidewalls of the first and second portions of the first electrode, respectively; and
a support pattern comprising spaced-apart first and second portions thereof on the first and second sidewalls of the first and second portions of the first electrode, respectively, comprising the dielectric layer thereon.

17. The semiconductor device of claim 16, wherein the dielectric layer comprises a portion thereof that extends continuously from:
the first portion of the support pattern to the first sidewall of the first portion of the first electrode;
the first sidewall of the first portion of the first electrode to the second sidewall of the second portion of the first electrode; and
the second sidewall of the second portion of the first electrode to the second portion of the support pattern.

18. The semiconductor device of claim 17, wherein the second sidewall of the second portion of the first electrode protrudes beyond an adjacent surface of the second portion of the first electrode and away from the first portion of the first electrode, such that the first and second portions of the first electrode comprise different first and second shapes, respectively.

19. The semiconductor device of claim 18, wherein:
the portion of the dielectric layer comprises a first portion of the dielectric layer that extends along a first portion of the first sidewall of the first portion of the first electrode; and
the first portion of the support pattern separates the first portion of the dielectric layer from a second portion of the dielectric layer that extends along a second portion of the first sidewall of the first portion of the first electrode.

20. The semiconductor device of claim 16, further comprising:
a substrate;
an interlayer insulating layer on the substrate; and
a contact plug in the interlayer insulating layer, wherein the first portion of the first electrode overlaps the contact plug.

* * * * *